United States Patent
Schein et al.

(10) Patent No.: US 8,760,327 B2
(45) Date of Patent: Jun. 24, 2014

(54) COORDINATE COMPRESSION USING POLYNOMIALS

(71) Applicant: Hewlett-Packard Development Company, L.P., Houston, TX (US)

(72) Inventors: Sagi Schein, Haifa (IL); David Lehavi, Haifa (IL); Hila Nachlieli, Haifa (IL)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/660,686

(22) Filed: Oct. 25, 2012

(65) Prior Publication Data

US 2014/0118171 A1  May 1, 2014

(51) Int. Cl.
*H03M 7/30* (2006.01)

(52) U.S. Cl.
USPC .................................. 341/87; 341/50; 341/51

(58) Field of Classification Search
USPC ................. 341/50, 51, 87; 382/275, 243, 238
See application file for complete search history.

(56) References Cited

U.S. PATENT DOCUMENTS

| | | | |
|---|---|---|---|
| 6,252,960 B1 * | 6/2001 | Seroussi | 380/30 |
| 6,771,826 B2 * | 8/2004 | Boon | 382/238 |
| 6,828,293 B1 * | 12/2004 | Hazenkamp et al. | 510/376 |
| 6,836,569 B2 | 12/2004 | Le Pennec et al. | |
| 6,901,555 B2 | 5/2005 | Hida et al. | |
| 7,424,172 B2 * | 9/2008 | Nose et al. | 382/275 |
| 7,698,577 B2 * | 4/2010 | Jones et al. | 713/300 |
| 2002/0126803 A1 * | 9/2002 | Jones et al. | 379/22.02 |
| 2003/0076878 A1 * | 4/2003 | Jones et al. | 375/219 |
| 2008/0063292 A1 * | 3/2008 | Nose et al. | 382/243 |
| 2010/0256927 A1 * | 10/2010 | Hala et al. | 702/33 |
| 2010/0322476 A1 | 12/2010 | Kanhere et al. | |

OTHER PUBLICATIONS

Kravtchenko, V., "Tracking Color Objects in Real Time", Aug. 27, 1999, 82 p.

Watson et al., "Wavelet Transforms on Vector Spaces as a Method of Multispectral Image Characterisation," Jul. 4-6, 1995, pp. 222-226.

* cited by examiner

*Primary Examiner* — Jean B Jeanglaude

(57) ABSTRACT

A method for compressing a plurality of coordinates includes obtaining a plurality of approximately-zero polynomials of dimension dim for a plurality of coordinate parameters. The method further includes selecting dim+1 non-approximately-zero polynomials, and providing a compressed data set that includes the approximately-zero polynomials, the dim+1 non-approximately-zero polynomials, and evaluations of the selected dim+1 non-approximately-zero polynomials based on the coordinates.

19 Claims, 7 Drawing Sheets

COORDINATE COMPRESSION USING POLYNOMIALS

BACKGROUND

Data analysis is ubiquitous. Some data, however, is not numerical and, even if numerical, may be non-linear. Examples of non-numerical data include scanned documents and photographs. Computers, of course, only understand numbers so non-numerical data may be converted to numbers for the computer to understand and further processing. Compressing non-numerical data is challenging.

BRIEF DESCRIPTION OF THE DRAWINGS

For a detailed description of illustrative examples, reference will now be made to the accompanying drawings in which.

DETAILED DESCRIPTION

Figure 1:
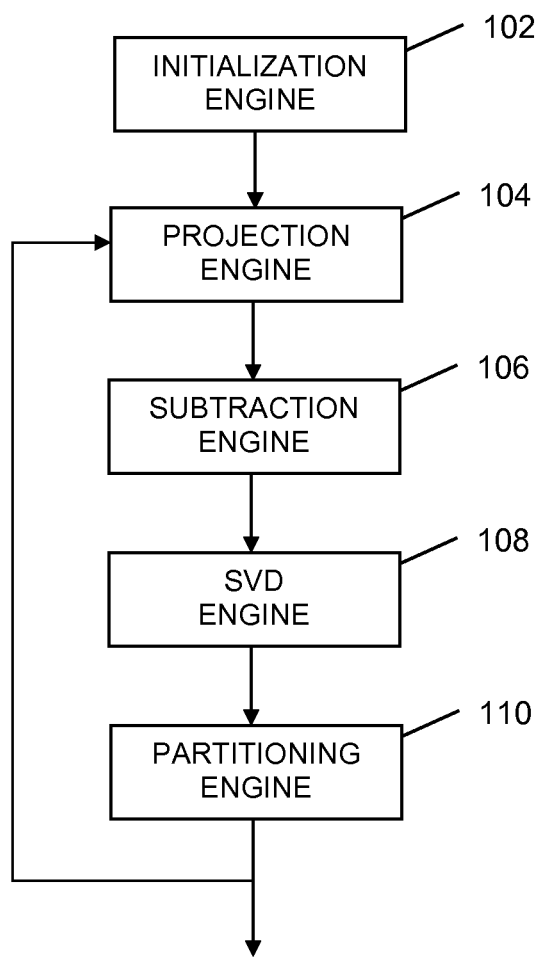
FIG. 1 shows an example of a system for performing a Stable Approximate Vanishing Ideal (SAVI) technique in accordance with an example.

A technique for compression is described herein. The disclosed compression technique is based on a Stable Approximate Vanishing Ideal (SAVI) technique. SAVI is a technique in which data points (also called "coordinates") related to, for example, a non-linear input data set are processed to determine various polynomials that describe the coordinates. The following discussion first discloses an implementation for the SAVI technique and then describes an example of the application of SAVI for data compression.

Overview of SAVI

In accordance with various implementations, numbers may be extracted from (e.g., derived from, measured based on, etc.) non-numerical data so that a computing device can further analyze the extracted numerical data and/or perform a desirable type of operation on the data. The extracted numerical data may be referred to as "data points" or "coordinates."

A type of technique for analyzing the numerical data extracted from non-numerical data includes determining a unique set of polynomials for each class of interest and then evaluating the polynomials on a plurality of coordinates. For a given set of coordinates, the polynomials of one of the classes may evaluate to 0 or approximately 0. The coordinates are then said to belong to the class corresponding to those particular polynomials. For compression, data pertaining to one particular class is compressed using the polynomials corresponding to that particular class. For example, if a digital photograph of a certain person is to be compressed, the polynomials previously determined to correspond to that person are used during the compression process.

The polynomials used during the compression process first are determined using the SAVI technique. The SAVI technique is described below.

Measurements can be made on many types of non-numerical data. For example, in the context of alphanumeric character recognition, multiple different measurements can be made for each alphanumeric character encountered in a scanned document. Examples of such measurements include the average slope of the lines making up the character, a measure of the widest portion of the character, a measure of the highest portion of the character, etc. The goal is to determine a suitable set of polynomials for each possible alphanumeric character. Thus, capital A has a unique set of polynomials, B has its own unique set of polynomials, and so on. Each polynomial is of degree deg (deg could be 1, 2, 3, etc.) and may use some or all of the measurement values as inputs. The measurements (i.e., coordinates) are the variables in the polynomials.

A class of techniques called Approximate Vanishing Ideal (AVI) may be used to determine polynomials to use for each class. The word "vanishing" refers to the fact that a polynomial evaluates to 0 for the right set of input coordinates. Approximate means that the polynomial only has to evaluate to approximately 0 for classification purposes. Many of these techniques, however, are not stable. Lack of stability means that the polynomials do not perform well in the face of noise. For example, if there is some distortion of the letter A or extraneous pixels around the letter, the polynomial for the letter A may not at all vanish to 0 even though the measurements were made for a letter A. Some AVI techniques are based on a pivoting technique which is fast but inherently unstable.

The implementations discussed below are directed to a Stable Approximate Vanishing Ideal (SAVI) technique which, as its name suggests, is stable in the face of noise in the input data.

Figure 2:
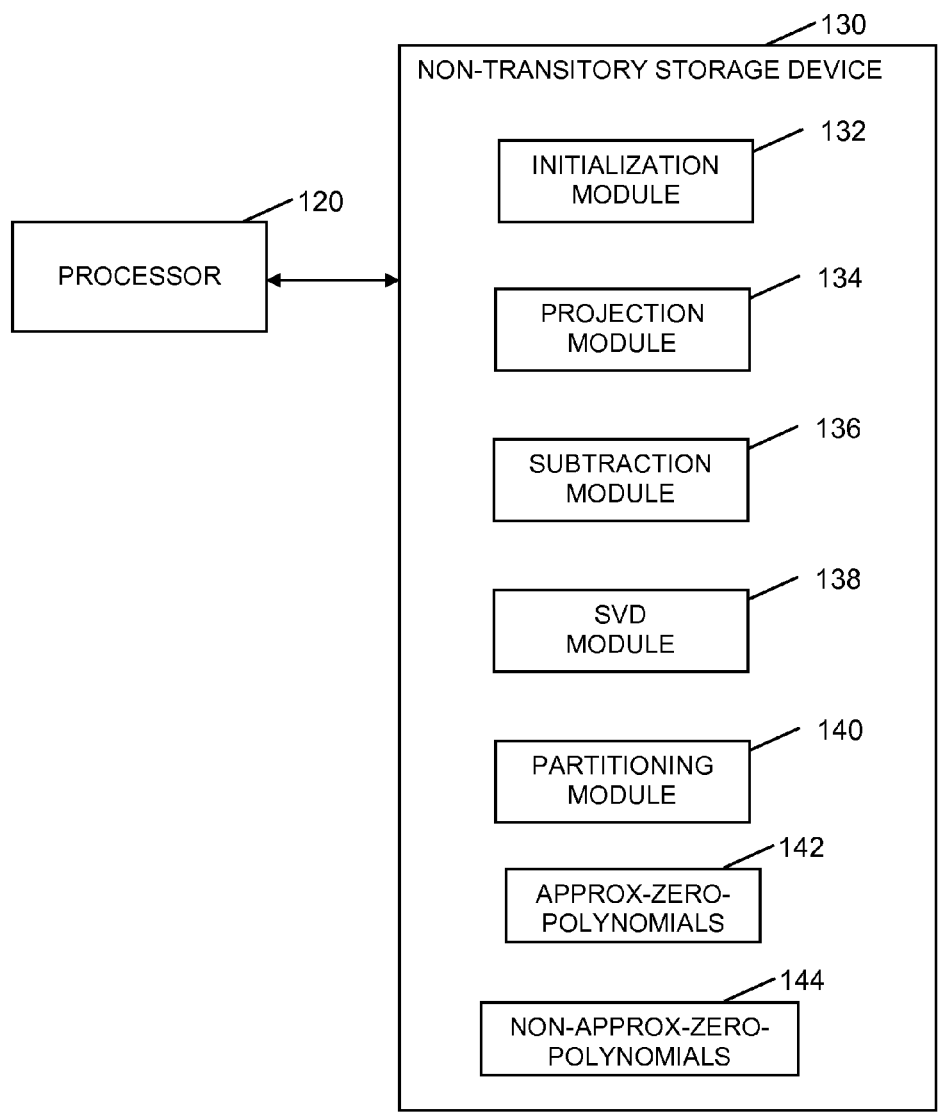
FIG. 2 shows another example of an implementation of a system for performing the SAVI technique.

FIG. 1 illustrates a system which includes various engines—an initialization engine 102, a projection engine 104, a subtraction engine 106, a singular value decomposition (SVD) engine 108, and a partitioning engine 110. In some examples, each engine 102-110 may be implemented as a processor executing software. FIG. 2, for example, shows one suitable example in which a processor 120 is coupled to a non-transitory storage device 130. The non-transitory storage device 130 may be implemented as volatile storage (e.g., random access memory), non-volatile storage (e.g., hard disk drive, optical storage, solid-state storage, etc.) or combinations of various types of volatile and/or non-volatile storage.

The non-transitory storage device 130 is shown in FIG. 2 to include a software module that corresponds functionally to each of the engines of FIG. 1. The software modules include an initialization module 132, a projection module 134, a subtraction module 136, an SVD module 138, and a partitioning module 140. Each engine of FIG. 1 may be implemented as the processor 120 executing the corresponding software module of FIG. 2.

The distinction among the various engines 102-110 and among the software modules 132-140 is made herein for ease of explanation. In some implementations, however, the functionality of two or more of the engines/modules may be combined together into a single engine/module. Further, the functionality described herein as being attributed to each engine 102-110 is applicable to the software module corresponding to each such engine, and the functionality described herein as being performed by a given module is applicable as well as to the corresponding engine.

Figure 3:
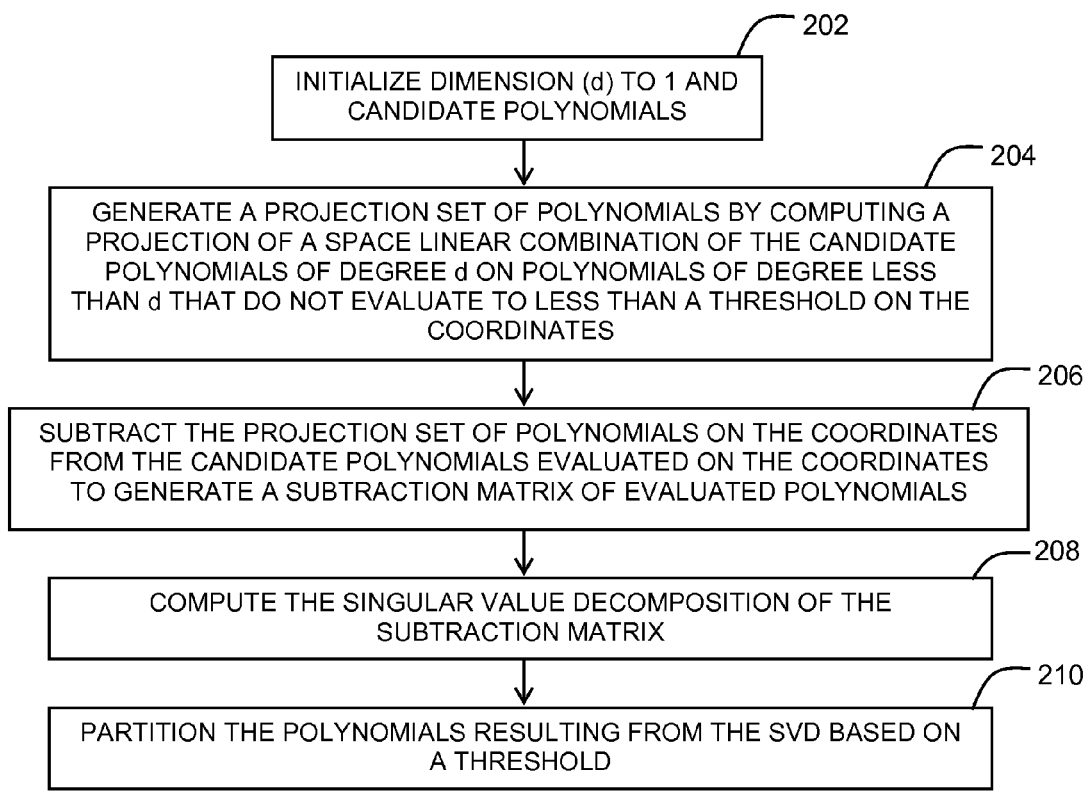
FIG. 3 shows a method of performing the SAVI technique in accordance with various examples.

The functions performed by the various engines 102-110 of FIG. 1 will now be described with reference to the flow diagram of FIG. 3. The SAVI process described herein may be an iterative process and the actions illustrated in FIG. 3 represent one iteration of the process. The SAVI process depicted in FIG. 3 is performed for each class for which polynomials are desired to be generated. The coordinates referenced below represent training data used to generate the correct polynomials.

The initialization engine 102 initializes a degree (d) to 1 (action 202). The disclosed SAVI process thus begins with dimension 1 polynomials. The initialization engine 102 also initializes a set of candidate polynomials. The candidate polynomials represent the polynomials that will be processed in the given iteration to determine which, if any, of the polynomials evaluate on a given set of coordinates to approximately 0 (e.g., below a threshold). Those candidate polynomials that do evaluate on the coordinates to less than the threshold are chosen as polynomials for the given class. The initial set of candidate polynomials may include all of the monomials in the coordinates. That is, there are as many monomials as there are coordinates in the training data.

The projection engine 104 then processes the set of candidate polynomials, for example, as described in illustrative action 204 in FIG. 3. In action 204, the projection engine 104 generates a projection set of polynomials. In some implementations, the projection set of polynomials is generated by computing a projection of a space linear combination of the candidate polynomials of degree deg on polynomials of degree less than deg that do not evaluate to 0 on the coordinates. Polynomials that do not evaluate to approximately 0 on the coordinates are referred to as "non-approximately-zero polynomials." In the first iteration of the process d is 1 but in subsequent iterations through the process, deg is incremented (2, 3, etc.). In the first pass through the algorithm with d equal to 1, the polynomials of degree less than deg (i.e., degree 0) that do not evaluate to 0 on the coordinates are represented by a scalar value such as 1/sqrt(number of points), where "sqrt" refers to the square root operator.

The following is an example of the computation of the linear combination of the candidate polynomials of degree d on the polynomials of degree less than d that do not evaluate to 0 on the coordinates. The projection engine 104 may multiply the polynomials of degree less than d that do not evaluate to 0 by the polynomials of degree less than deg that do not evaluate to 0 evaluated on the points and then multiply that result by the candidate polynomials of degree d evaluated on the coordinates. In one example, the projection engine 104 computes:

$$E_{deg} = O_{<deg} O_{<deg}(P)^t C_d(P)$$

where $O_{<deg}$ represents the set polynomials that do not evaluate to 0 and are of lower than order d, $O_{<deg}(P)^t$ represents the transpose of the matrix of the evaluations of the $O_{<deg}$ polynomials, and $C_{deg}(P)$ represents the evaluation of the candidate set of polynomials on the coordinates (P). $E_d$ represents the projection set of polynomials evaluated on the coordinates.

The subtraction engine 106 subtracts (as indicated at 206 in FIG. 3) the projection set of polynomials evaluated on the coordinates from the candidate polynomials evaluated on the coordinates to generate a subtraction matrix of evaluated polynomials, that is:

$$\text{Subtraction matrix} = C_{deg}(P) - E_{deg}(P)$$

The subtraction matrix represents the difference between evaluations of polynomials of degree d on the coordinates, and evaluations of polynomials of lower degrees on the coordinates.

The SVD engine 108 (at 208 in FIG. 3) then computes the singular value decomposition of the subtraction matrix. The SVD of the subtraction matrix results in the three matrices U, S, and $V^t$. U is a unitary matrix. S is a rectangular diagonal matrix in which the values on the diagonal are the singular values of the subtraction matrix. $V^t$ is the transpose of a unitary matrix and thus also a unitary matrix. That is:

$$\text{Subtraction matrix} = USV^*$$

A matrix may be represented as a linear transformation between two distinct spaces. To better analyze the matrix, rigid (i.e., orthonormal) transformations may be applied to these space. The "best" rigid transformations would be the ones which will result in the transformation being on a diagonal of a matrix, and that is exactly what the SVD achieve. The values on the diagonal of the S matrix are called the "singular values" of the transformation.

The candidate polynomials for the next iteration of the SAVI process either include all of the candidate polynomials from the previous iteration or a subset of such polynomials. If a subset is used, then the SAVI process removes from the candidate polynomials those polynomials that evaluate to less than the threshold. If candidate polynomials are to be removed for a subsequent iteration of the process, then such polynomials are removed from further use in a numerically stable manner as described below.

The partitioning engine 110 partitions (action 210 in FIG. 3) the polynomials resulting from the SVD of the subtraction matrix based on a threshold. The threshold may be preconfigured to be 0 or a value greater than but close to 0. Any polynomial that results in a value on the coordinates less than the threshold is considered to be a polynomial associated with the class of points being learned (i.e., an approximately-zero polynomial), while all other polynomials then become the candidate polynomials for the subsequent iteration of the SAVI process.

In one implementation, the partitioning engine 110 sets $U_{deg}$ equal to $(C_{de} - E_{deg})VS^{-1}$ and then partitions the polynomials of $U_{deg}$ according to the singular values to obtain $G_{deg}$ and $O_{deg}$. $G_{deg}$ is the set of polynomials that evaluate to less than the threshold on the coordinates (approximately-zero polynomials). $O_{deg}$ is the set of polynomials that do not evaluate to less than the threshold on the coordinates (i.e., the approximately-zero polynomials).

The partitioning engine 110 also may increment the value of d, multiply the set of candidate polynomials in degree deg-1 that do not evaluate to 0 on the coordinates by the degree 1 candidate polynomials that do not evaluate to 0 on the coordinates. The partitioning engine 110 further computes $D_{deg} = O_1 \times O_{deg-1}$ and then sets the candidate set of polynomials for the next iteration of the SAVI process to be the orthogonal complement in $D_{deg}$ of span $\cup_{i=1}^{deg-1} G_i \times O_{deg-i}$.

The partitioning engine 110 then may cause control to loop back to action 204 in FIG. 3 in which the projection engine 104 repeats its operation with an increased degree d and new set of candidate polynomials.

The approximately-zero polynomials may be stored in storage device 130 as shown at 142, while the non-approximately-zero polynomials may be stored in storage device at 144.

Compression

As explained below, compressing coordinates for a particular class includes performing the SAVI process, such as that described above, on the coordinates of the class to obtain various approximately-zero and non-approximately-zero polynomials, selecting various of the polynomials and evaluations of the non-approximately-zero polynomials to represent a compressed data set.

The coordinates being compressed may represent any type of data. For example, in the case of image compression, the coordinates may present measurements or values otherwise derived from the image being compressed. In the case of compression of a digital photograph of a face, examples of coordinates may include the spacing between the eyes, the ratio of height of face to width of face, etc. Such coordinates are derived from the image to be compressed. As explained above, computers process numbers. The coordinates derived from a non-numerical input image are numbers which can be processed by a computer. The compression technique described below results in the compression of the coordinates. Thus, if the input to be compressed is non-numerical data, coordinates are derived from the non-numerical data, and the coordinates themselves are compressed.

Figure 4:
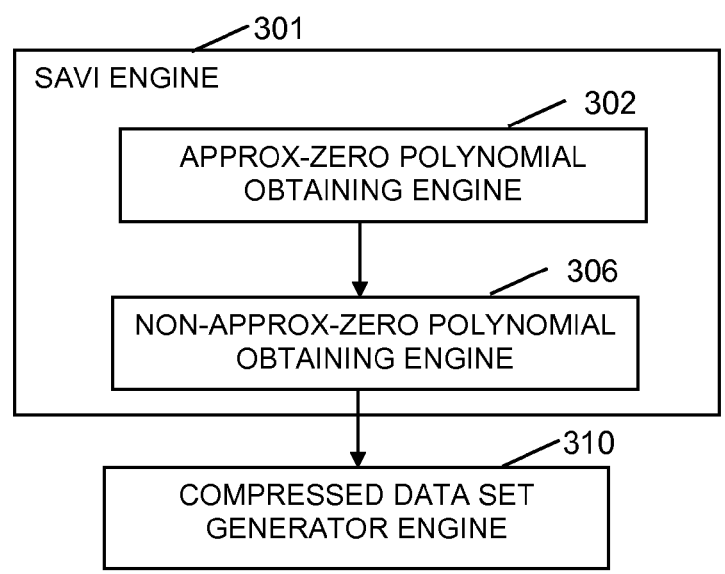
FIG. 4 shows a system of compressing coordinates in accordance with various examples.
Figure 5:
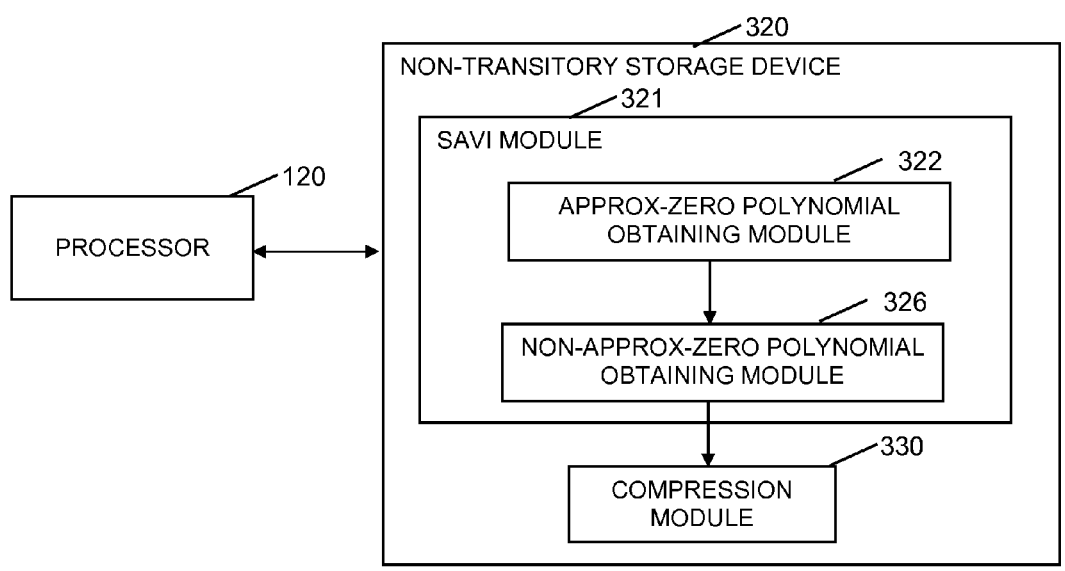
FIG. 5 shows another example of an implementation of a system for compressing coordinates.

FIG. 4 illustrates a system which includes various engines—a SAVI engine 301 and a compressed data set generator engine 310. The SAVI engine 301 may include an approximately-zero polynomial obtaining engine 302 and a non-approximately-zero selection engine 306. In some examples, each engine 301-310 may be implemented as a processor executing software. FIG. 5, for example, shows one suitable example in which processor 120 is coupled to a non-transitory storage device 320. The non-transitory storage device 320 may be implemented as volatile storage (e.g., random access memory), non-volatile storage (e.g., hard disk drive, optical storage, solid-state storage, etc.) or combinations of various types of volatile and/or non-volatile storage. The non-transitory storage device 320 may be the same storage device 130 as shown in FIG. 2 or may be a separate storage device. Similarly, the processor 120 of FIG. 5 may the same processor or a different processor from that shown in FIG. 2.

The non-transitory storage device 320 is shown in FIG. 5 to include a software module that corresponds functionally to each of the engines of FIG. 4. The software modules include a SAVI module 321 (which includes an approximately-zero polynomial obtaining module 322 and a non-approximately-zero selection module 326) and a compressed data set generator module 330. Each engine of FIG. 4 may be implemented as the processor 120 executing the corresponding software module of FIG. 5.

The distinction among the various engines 301-310 and among the software modules 321-330 is made herein for ease of explanation. In some implementations, however, the functionality of two or more of the engines/modules may be combined together into a single engine/module. Further, the functionality described herein as being attributed to each engine 301-310 is applicable to the software module corresponding to each such engine, and the functionality described herein as being performed by a given module is applicable as well as to the corresponding engine. The functions performed by the various engines 301-310 of FIG. 4 will now be described with reference to the flow diagram of FIG. 6.

Figure 6:
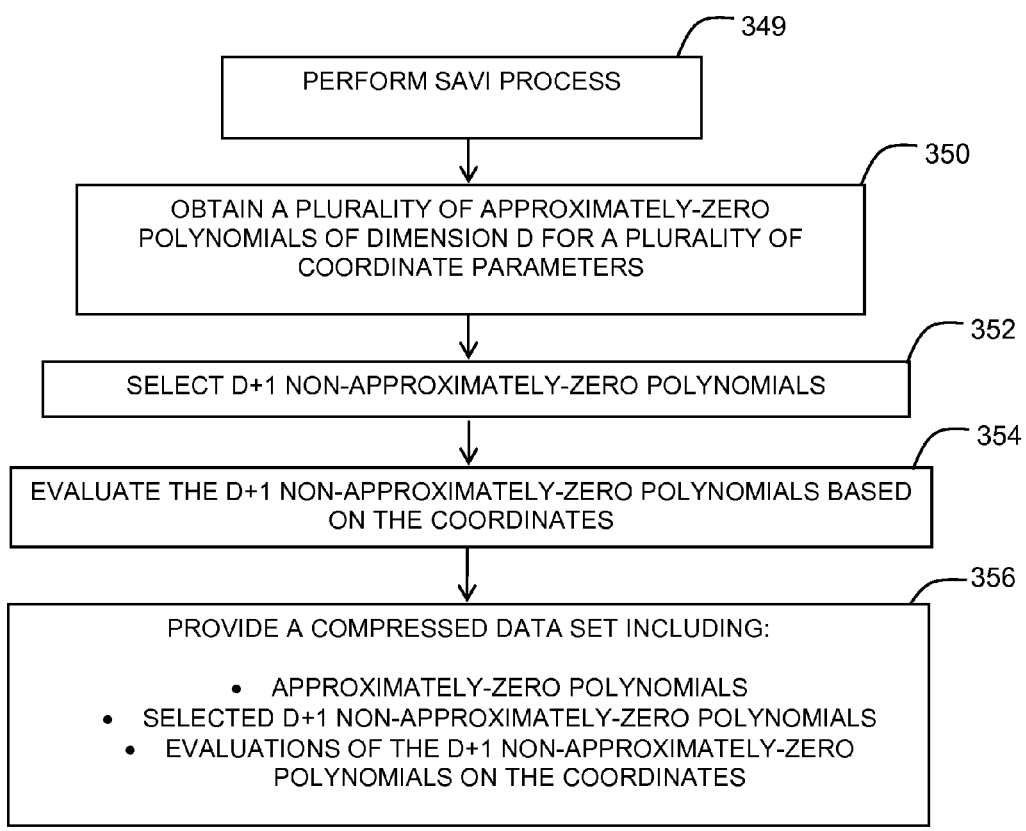
FIG. 6 shows a method of compressing coordinates in accordance with various examples.

The compression process depicted in FIG. 6 is performed on a plurality of coordinates pertaining to a particular class as explained above. Some implementations involve only a single class and all coordinates are compressed using polynomials corresponding to that single class. In other implementations, multiple classes are present and coordinates corresponding to each such class are compressed using polynomials of the corresponding class.

Referring to FIG. 6, the method performing the SAVI process at 349. The method then includes at 350 obtaining a plurality of approximately-zero polynomials of dimension dim (dim is an integer greater than or equal to 1) for a plurality of coordinate parameters. The term "coordinate parameter" is a broad term that refers to coordinates and functions of coordinates. Various implementations use functions whose values distinguish all of the points in the neighborhood of any point on the variety defined by the approximately-zero polynomials. To this end, functions are chosen whose normalized gradients, when projected on the tangent space to the variety defined by the approximately-zero polynomials, span a parallelogram of maximal volume. As such functions may not be able to meet this criteria for all points simultaneously, in some implementations, functions are chosen which satisfy the property on average on all of the points in the variety defined by the approximately-zero polynomials. Obtaining the approximately-zero polynomials may include retrieving the approximately-zero polynomials 142 from storage device 130 that may have been previously stored there when performing the SAVI process of FIG. 3. The particular approximately-zero polynomials obtained are the approximately-zero polynomials that correspond to the particular class for which the compression process is being performed.

By way of an example, if digital photographs of 10 people are to be compressed, the SAVI process is performed to determine the approximately-zero polynomials and non-approximately-zero polynomials for each of the 10 people. In this example, each person is considered to be a class. Then, when compressing a photograph of one of those 10 people, the SAVI process described above is performed and the approximately-zero polynomials corresponding to that particular person is obtained in operation 350 from storage device 130. Through any suitable mechanism, such as a graphical user interface (GUI) implemented by, for example, the approximately-zero polynomial obtaining engine 302, a user identifies the class to the engine 302 for which the polynomials are to be used.

At 352, the compression method includes selecting dim++1 non-approximately-zero polynomials. As explained above, dim represents the dimension of the approximately-zero polynomials obtained at 350. The number of selected non-approximately-zero polynomials should be at least dim+1 because there are always dim+1 functions which suffices—one simply immerses the variety generated by the approximately-zero d dimensional variety in dim+1 dimensional Euclidean space. On the other hand, if dim would suffice, it would mean that there is an isomorphism between the d dimensional object and the n-dimensional Euclidean space. This is not always the case. For example, a two-dimensional torus is not isomorphic even if one "takes away" from the torus some points. The number of selected non-approximately-zero polynomials could be greater than dim+1, but selecting more than dim+1 non-approximately-zero polynomials is unnecessary and thus wasteful given the nature of the problem which is data compression. Polynomials should be chosen which are as different as possible from one another, and from 0, for coordinates which are 0 on the non-zero polynomials. For example, the dim+1 non-approximately-zero polynomials corresponding to the higher singular values may be chosen.

At 354, the method includes evaluating the selected dim+1 non-approximately-zero polynomials based on the coordinates. Because these polynomials are not the approximately-zero polynomials, the evaluations are not 0 or approximately 0. The evaluations are numbers substantially greater (in an absolute value sense) than 0.

At 356, the method includes providing a compressed data set. The compressed data set may include:

The approximately-zero polynomials obtained at operation 350

The d+1 non-approximately-zero polynomials selected at operation 352

The evaluations of the dim++1 non-approximately-zero polynomials.

The compressed data set may be stored in a storage device (e.g., storage device 130, storage device 320, etc.) and/or transmitted by the processor that performed the compression method of FIG. 6 (e.g., processor 120) to another processor or computer. If transmitted to another processor or computer, the transmission of the compressed data set may be over a local or wide area network (e.g., the Internet).

Decompression

Figure 7:
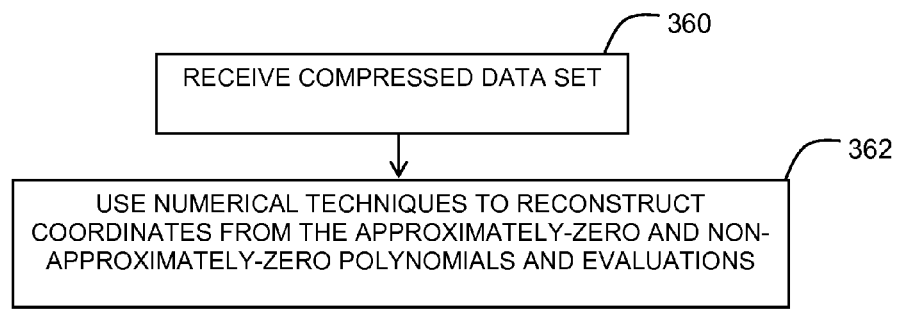
FIG. 7 shows a method of decompressing a compressed data set in accordance with various examples.
Figure 8:
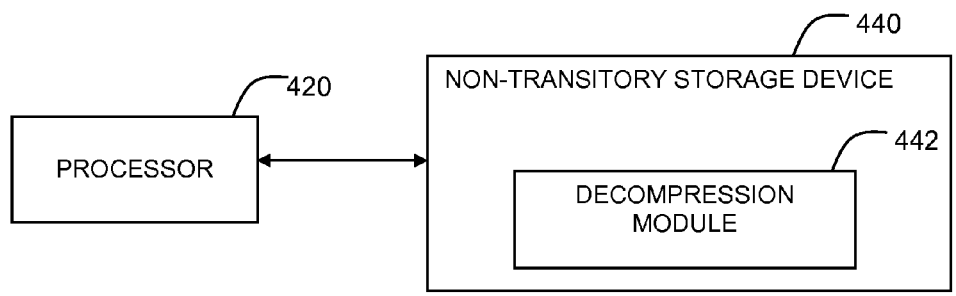
FIG. 8 shows a system for decompressing the compressed data set in accordance with various examples.
Figure 9:
FIG. 9 shows an implementation of the system for decompressing the compressed data set in accordance with various examples.

FIG. 7 shows an illustrative method for decompressing the compressed data. The decompression method of FIG. 7 may be performed by processor 120 or another processor/computer executing a software module. FIG. 8 show a decompression engine 435 that receives the compressed data set and reconstructs the coordinates from the compressed data set. FIG. 9 shows an example of an implementation of the decompression engine and includes a processor 420 coupled to a non-transitory storage device 440 which contains a decompression module 442. The decompression module 442 includes software that is executable by the processor 420 to perform the decompression method of FIG. 7. The processor 420 may be a different processor from the processor that performed the SAVI technique to determine the polynomials or the processor that performed the compression method of FIG. 6.

The decompression method of FIG. 7 includes receiving (360) the compressed data set. As explained above, the compressed data set includes a plurality of polynomials, some of which evaluate to approximately zero and other polynomials evaluate to values other than zero or approximately zero. The variables in the polynomials represent the original coordinates.

At 362, the decompression method includes using numerical techniques to reconstruct the coordinates from the approximately-zero polynomials and the non-approximately-zero polynomials.

In some embodiments, all of the various engines depicted in FIGS. 1, 4, and 8 are implemented as part of one cohesive system.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method for compressing a plurality of coordinates, comprising:
    obtaining, by executing a module stored on a non-transitory computer-readable storage device, a plurality of approximately-zero polynomials of dimension dim for a plurality of coordinate parameters;
    selecting dim+−1 non-approximately-zero polynomials; and
    providing a compressed data set that includes the approximately-zero polynomials, the dim+1 non-approximately-zero polynomials, and evaluations of the selected dim+1 non-approximately-zero polynomials based on the coordinates.

2. The method of claim 1, further comprising receiving the compressed data set and reconstructing the coordinates based on the approximately-zero polynomials, the dim+1 non-approximately-zero polynomials, and the evaluations.

3. The method of claim 1, wherein selecting dim+1 non-approximately-zero polynomials comprises selecting no more than dim+1 non-approximately-zero polynomials.

4. The method of claim 1, further comprising determining the approximately-zero polynomials and the dim+1 non-approximately-zero polynomials, and wherein determining the approximately-zero polynomials and the dim+1 non-approximately-zero polynomials comprises generating a projection set of polynomials by computing a projection of a space linear combination of candidate polynomials of degree d on polynomials of degree less than deg that do not evaluate to less than a threshold on the plurality of coordinates.

5. The method of claim 4 wherein determining the approximately-zero polynomials and the dim+1 non-approximately-zero polynomials further comprises subtracting the projection set of polynomials evaluated on the coordinates from the candidate polynomials evaluated on the coordinates to generate a subtraction matrix of evaluated polynomials.

6. The method of claim 5 wherein determining the approximately-zero polynomials and the dim+1 non-approximately-zero polynomials further comprises computing the singular value decomposition of the subtraction matrix of evaluated polynomials and partitioning the polynomials resulting from the singular value decomposition based on a threshold.

7. A system, comprising:
    an approximately-zero polynomial obtaining engine to obtain a plurality of approximately-zero polynomials of dimension dim for a plurality of coordinate parameters;
    a non-approximately-zero selection engine to select dim+1 non-approximately-zero polynomials; and
    a compression engine to provide a compressed data set that includes the approximately-zero polynomials, the dim+1 non-approximately-zero polynomials, and evaluations of the selected dim+1 non-approximately-zero polynomials based on the coordinates.

8. The system of claim 7, further comprising a decompression engine to receive the compressed data set and reconstruct the coordinates based on the approximately-zero polynomials, the dim+1 non-approximately-zero polynomials, and the evaluations.

9. The system of claim 7, wherein the non-approximately-zero selection engine selects no more than dim+1 non-approximately-zero polynomials.

10. The system of claim 7, further comprising a projection engine to generate a projection set of polynomials of a space linear combination of candidate polynomials of degree d on polynomials of degree less than deg that do not evaluate to less than a threshold on the plurality of coordinates.

11. The system of claim 10, further comprising a subtraction engine to generate a subtraction matrix based on the projection set of polynomials evaluated on the coordinates and the candidate polynomials evaluated on the coordinates.

12. The system of claim 11, further comprising a singular value decomposition engine to compute the singular value decomposition of the subtraction matrix of evaluated polynomials.

13. The system of claim 12, further comprising a partitioning engine to partition the polynomials resulting from the singular value decomposition based on a threshold.

14. A non-transitory, computer-readable storage device containing software than, when executed by a processor, causes the processor to:

obtain a plurality of approximately-zero polynomials of dimension dim for a plurality of coordinate parameters;

select dim+1 non-approximately-zero polynomials; and provide a compressed data set that includes the approximately-zero polynomials, the dim+1 non-approximately-zero polynomials, and evaluations of the selected dim+1 non-approximately-zero polynomials based on the coordinates.

15. The non-transitory, computer-readable storage device of claim 14, wherein the software causes the processor to receive the compressed data set and reconstruct the coordinates based on the approximately-zero polynomials, the dim+1 non-approximately-zero polynomials, and the evaluations.

16. The non-transitory, computer-readable storage device of claim 14, wherein the software causes the processor to select the dim+1 non-approximately-zero polynomials by selecting no more than dim+1 non-approximately-zero polynomials.

17. The non-transitory, computer-readable storage device of claim 14, wherein the software causes the processor to determine the approximately-zero polynomials and the dim+1 non-approximately-zero polynomials by generating a projection set of polynomials and wherein the software causes the processor to generate the projection set of polynomials comprises computing a projection of a space linear combination of candidate polynomials of degree deg on polynomials of degree less than deg that do not evaluate to less than a threshold on the plurality of coordinates.

18. The non-transitory computer-readable storage device of claim 17 wherein the software further causes the processor to determine the approximately-zero polynomials and the dim+1 non-approximately-zero polynomials by subtracting the projection set of polynomials evaluated on the coordinates from the candidate polynomials evaluated on the coordinates to generate a subtraction matrix of evaluated polynomials.

19. The non-transitory, computer-readable storage device of claim 18 wherein the software further causes the processor to determine the approximately-zero polynomials and the dim+1 non-approximately-zero polynomials by computing the singular value decomposition of the subtraction matrix of evaluated polynomials and partitioning the polynomials resulting from the singular value decomposition based on a threshold.

* * * * *

UNITED STATES PATENT AND TRADEMARK OFFICE
CERTIFICATE OF CORRECTION

PATENT NO.       : 8,760,327 B2
APPLICATION NO.  : 13/660686
DATED            : June 24, 2014
INVENTOR(S)      : Sagi Schein et al.

Page 1 of 1

It is certified that error appears in the above-identified patent and that said Letters Patent is hereby corrected as shown below:

In the claims

In column 7, line 61, in Claim 1, delete "dim+-1" and insert -- dim+1 --, therefor.

In column 10, line 7, in Claim 18, delete "non-transitory" and insert -- non-transitory, --, therefor.

Signed and Sealed this
Ninth Day of June, 2015

Michelle K. Lee
*Director of the United States Patent and Trademark Office*